(12) United States Patent
Sekito et al.

(10) Patent No.: US 9,835,942 B2
(45) Date of Patent: *Dec. 5, 2017

(54) PHOTOSENSITIVE RESIN COMPOSITION AND USE THEREOF

(75) Inventors: Yoshihide Sekito, Shiga (JP); Tomohiro Koda, Shiga (JP); Tetsuya Kogiso, Shiga (JP); Masayoshi Kido, Shiga (JP)

(73) Assignee: KANEKA CORPORATION, Osaka (JP)

(*) Notice: Subject to any disclaimer, the term of this patent is extended or adjusted under 35 U.S.C. 154(b) by 161 days.

This patent is subject to a terminal disclaimer.

(21) Appl. No.: 13/993,613

(22) PCT Filed: Sep. 30, 2011

(86) PCT No.: PCT/JP2011/072612
§ 371 (c)(1),
(2), (4) Date: Jun. 12, 2013

(87) PCT Pub. No.: WO2012/081295
PCT Pub. Date: Jun. 21, 2012

(65) Prior Publication Data
US 2013/0264099 A1    Oct. 10, 2013

(30) Foreign Application Priority Data

Dec. 14, 2010 (JP) ................... 2010-278589
Apr. 25, 2011 (JP) ................... 2011-097503

(51) Int. Cl.
G03F 7/004        (2006.01)
H05K 3/28         (2006.01)
(Continued)

(52) U.S. Cl.
CPC .............. *G03F 7/004* (2013.01); *G03F 7/027* (2013.01); *G03F 7/032* (2013.01); *G03F 7/035* (2013.01);
(Continued)

(58) Field of Classification Search
CPC .......... G03F 7/004; G03F 7/032; G03F 7/035; G03F 7/027; G03F 7/40; H05K 1/0298; H05K 3/287; C08F 2/50
See application file for complete search history.

(56) References Cited

U.S. PATENT DOCUMENTS 4,238,385 A    12/1980   Okado et al.
8,784,956 B2   7/2014    Saitou et al.
(Continued)

FOREIGN PATENT DOCUMENTS

CN    101278236    10/2008
CN    101845216    9/2010
(Continued)

OTHER PUBLICATIONS

International Preliminary Report on Patentability, PCT/JP2011/072612.
(Continued)

*Primary Examiner* — Michael Pepitone
(74) *Attorney, Agent, or Firm* — Kagan Binder, PLLC

(57) ABSTRACT

In order to provide (A) a photosensitive resin composition which (i) obtains an excellent tack-free property after being applied and dried, (ii) can be subjected to fine processing so as to have photosensitivity, (iii) prepares a cured film having excellent flexibility, flame retardancy, and electrical insulation reliability, and (iv) has small warpage after being cured, (B) a resin film, (C) an insulating film, and (D) an printed wiring board provided with an insulating film, the photosensitive resin composition containing at least (A) binder
(Continued)

polymer; (B) cross-linked polymer particles, whose polymer has a urethane bond in its molecule; (C) thermosetting resin; and (D) photo-polymerization initiator is used.

14 Claims, 1 Drawing Sheet

(51) Int. Cl.
*H05K 1/02* (2006.01)
*G03F 7/027* (2006.01)
*G03F 7/032* (2006.01)
*G03F 7/035* (2006.01)
*G03F 7/40* (2006.01)

(52) U.S. Cl.
CPC ............ *G03F 7/40* (2013.01); *H05K 1/0298* (2013.01); *H05K 3/287* (2013.01)

(56) References Cited

U.S. PATENT DOCUMENTS

| | | | |
|---|---|---|---|
| 8,993,897 B2 | 3/2015 | Sekito | |
| 2003/0122371 A1 | 7/2003 | Rochford et al. | |
| 2004/0063815 A1 | 4/2004 | Kinose et al. | |
| 2004/0197524 A1 | 10/2004 | Rochford et al. | |
| 2004/0232813 A1 | 11/2004 | Nakano et al. | |
| 2005/0158088 A1 | 7/2005 | Someya et al. | |
| 2006/0088349 A1 | 4/2006 | Someya et al. | |
| 2008/0300350 A1 | 12/2008 | Ohno et al. | |
| 2009/0008138 A1 | 1/2009 | Uchida et al. | |
| 2009/0065244 A1 | 3/2009 | Kimura et al. | |
| 2009/0171015 A1 | 7/2009 | Uchida et al. | |
| 2009/0312519 A1 | 12/2009 | Uera et al. | |
| 2010/0041785 A1 | 2/2010 | Ohashi et al. | |
| 2010/0196822 A1 | 8/2010 | Sasaki et al. | |
| 2011/0083884 A1 | 4/2011 | Okada et al. | |
| 2012/0083552 A1 | 4/2012 | Ma | |
| 2012/0138868 A1 | 6/2012 | Arifuku et al. | |
| 2012/0183776 A1 | 7/2012 | Arioka et al. | |
| 2012/0250268 A1 | 10/2012 | Ito et al. | |
| 2013/0264099 A1 | 10/2013 | Sekido et al. | |
| 2013/0337161 A1 | 12/2013 | Akimoto et al. | |

FOREIGN PATENT DOCUMENTS

| | | |
|---|---|---|
| JP | 55-27647 | 2/1980 |
| JP | 09-136931 | 5/1997 |
| JP | H09-137109 | 5/1997 |
| JP | 2000-241969 | 9/2000 |
| JP | 2001-324801 | 11/2001 |
| JP | 2002-293882 | 10/2002 |
| JP | 2002-296776 | 10/2002 |
| JP | 2002-322221 | 11/2002 |
| JP | 2004-99635 | 4/2004 |
| JP | 2006-40935 | 2/2006 |
| JP | 2006-86196 | 3/2006 |
| JP | 2008-181750 | 8/2008 |
| JP | 2009-069664 | 4/2009 |
| JP | 2009-230076 | 10/2009 |
| JP | 2009-271445 | 11/2009 |
| JP | 2010-48854 | 3/2010 |
| JP | 2010-117452 | 5/2010 |
| JP | 2010-139559 | 6/2010 |
| JP | 2010-143988 | 7/2010 |
| JP | 2010-169810 | 8/2010 |
| JP | 2010-224158 | 10/2010 |
| JP | 2011-52202 | 3/2011 |
| JP | 2011-190424 | 9/2011 |
| KR | 2010/0069559 | 6/2010 |
| KR | 2011/0033181 | 3/2011 |
| TW | 200811229 | 3/2008 |
| TW | 201105720 | 2/2011 |
| WO | 2007/125806 | 11/2007 |
| WO | 2011/062053 | 5/2011 |

OTHER PUBLICATIONS

PCT International Search Report and Written Opinion, PCT/JP2011/072612, 6 pgs.
English Translation of International Preliminary Report on Patentability, International Application No. PCT/JP2012/060978, dated Nov. 7, 2013.
Notice of Allowance, U.S. Appl. No. 14/113,541, dated Dec. 22, 2014.
English Translation of International Search Report, International Application No. PCT/JP2012/060978, dated May 29, 2012.
English Translation of International Search Report, International Application No. PCT/JP2012/082874, dated Apr. 2, 2013.
English Translation of International Preliminary Report on Patentability, International Application No. PCT/JP2012/082874, dated Aug. 7, 2014.
Prosecution History from U.S. Appl. No. 14/374,444 through Nov. 5, 2015.
Prosecution History from U.S. Appl. No. 14/374,465 through Mar. 3, 2016.
International Search Report from International Application No. PCT/JP2012/082968, dated Apr. 2, 2013.
International Preliminary Report on Patentability from International Application No. PCT/JP2012/082968, dated Aug. 7, 2014.
Non-Final Office Action from copending U.S. Appl. No. 14/374,456, dated Dec. 15, 2016.
Non-Final Office Action for U.S. Appl. No. 14/374,465, dated Sep. 6, 2017 (23 pages).

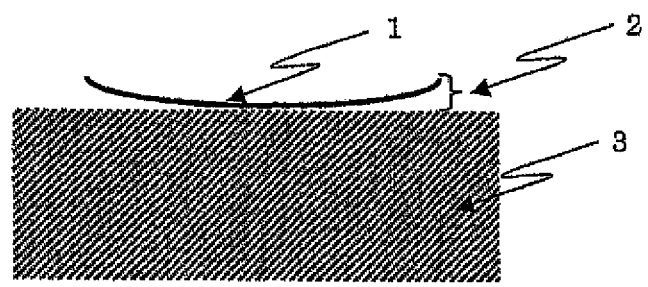

PHOTOSENSITIVE RESIN COMPOSITION AND USE THEREOF

This application claims benefit from International Application No. PCT/JP2011/072612, which was filed on Sep. 30, 2011, which in turn claims priority to Japanese Application No. 2010-278589, which was filed on Dec. 14, 2010, and Japanese Application No. 2011-097503, which was filed on Apr. 25, 2011, wherein the entireties of said patent applications are incorporated herein by reference.

TECHNICAL FIELD

The present invention relates to (A) a photosensitive resin composition which (i) obtains an excellent tack-free property after being applied and dried, (ii) can be subjected to fine processing so as to have photosensitivity, (iii) prepare a cured film having excellent flexibility, flame retardancy, and electrical insulation reliability, and (iv) has small warpage after being cured, (B) a resin film, (C) an insulating film, and (D) an printed wiring board provided with an insulating film.

BACKGROUND ART

Polyimide resin is widely used for electric and electronic purposes because the polyimide resin has an excellent heat resistance, electrical insulation reliability, chemical resistance, and mechanical property. For example, the polyimide resin is used for forming (A) insulating films and protective coating agents onto semiconductor devices, (B) base materials and surface protective materials of flexible circuit substrates, integrated circuits, etc., and (C) interlayer insulating films and protective films of extremely small circuits.

There has been used a cover lay film particularly as a surface protective material for flexible circuit substrates, which cover lay film can be obtained by applying an adhesive to a molding product such as a polyimide film. The cover lay film is adhered to a flexible circuit substrate generally in such a way that an opening is secured by means of punching etc. in advance at a bonding portion between the cover lay film and a terminal portion or component of a circuit, the opening and the cover lay film are aligned with each other, and then the cover lay film and the flexible circuit substrate are subjected to thermocompression bonding with use of a thermal press etc.

It is, however, difficult to secure an opening in a thin cover lay film with a high accuracy, and the alignment to bond the cover lay film and the flexible circuit substrate to each other is usually carried out manually. This causes insufficiently accurate alignment, low workability at the time of bonding, and high costs.

Meanwhile, a solder resist or the like is also used as a surface protective material for circuit substrates, and, particularly, a solder resist having a photosensitivity function is preferably used in a case where a fine processing is necessary. Such a photosensitive solder resist is made from a photosensitive resin composition mainly containing acid-modified epoxy acrylate, epoxy resin, etc. The photosensitive solder resist has an excellent electrical insulation reliability as an insulating material. However, the photosensitive solder resist has a bad mechanical property such as flexibility, and is largely shrunk when being cured. Therefore, a warpage of a circuit substrate becomes large in a case where the photosensitive solder resist is laminated onto a thin and plastic circuit substrate such as a flexible circuit substrate. This makes it difficult to use a photosensitive solder resist for flexible circuit substrates. The photosensitive solder resist has poor flame retardancy, and therefore, in a case where a flame retardant is added to the photosensitive solder resist to apply flame retardancy, the photosensitive solder resist causes problems such as (i) reduction in physical property and (ii) a contact fault and contamination during processes, each of which is caused by bleed out which is a phenomenon that a flame retardant is soaked out of a cured film.

There have been proposed various photosensitive solder resists which can exhibit flexibility and flame retardancy.

For example, Patent Literature 1 discloses a photosensitive resin composition which (i) has excellent flexibility, excellent solder heat resistance, high sensitivity, and high resolution, and (ii) can makes it easy to form a fine pattern on a heat-resistant protective film.

One of important properties in a case where a photosensitive solder resist is processed is a tack-free property, i.e., low tackiness of a surface after the surface is applied with a material of the film and a solvent is dried. The high tack-free property is an important property because (i) the high tack-free property prevents a photomask, which is necessary for forming a fine pattern, from adhering to a surface of an applied film to thereby contaminate the surface in a case where the photomask is provided on the surface of the applied film and the surface is radiated by ultraviolet rays, and (ii) the high tack-free property prevents circuit substrates from adhering to each other in a case where the circuit substrates applied with films which have not been radiated yet with ultraviolet rays are stacked on one another.

As a method for improving the tack-free property after the photosensitive solder resist is applied and dried, there employs a method of adding inorganic fillers to cause an applied film to have a rough surface. The method, however, has a problem in that the film after curing (cured film) becomes weak because the inorganic fillers are hard, and cracking occurs on the cured film, thereby causing peeling-off of the cured film from a base material.

In view of the circumstances, for example, Patent Literature 2 discloses a high performance ink composition for use in a photo-curable liquid solder resist, which ink composition (A) has a high sensitivity and excellent tack-free and developing properties of a film and (B) does not decrease adhesiveness or does not peel off due to cracking or/and volumetric shrinkage.

CITATION LIST

Patent Literature 1
Japanese Patent Application Publication, Tokukai, No. 2000-241969 A (Publication date: Sep. 8, 2000)
Patent Literature 2
Japanese Patent Application Publication, Tokukaihei, No. 9-137109 A (Publication date: May 27, 1997)

SUMMARY OF INVENTION

Technical Problem

The above Patent Literatures propose various methods for solving problems of photosensitive solder resists.

The photosensitive resin composition disclosed in Patent Literature 1 has excellent sensitivity, resolution, folding endurance, and flame retardancy because the photosensitive resin composition contains a urethane compound and aromatic phosphate ester which has an ethylene unsaturated bond and has a flexible skeleton. However, the photosensitive resin composition has a poor tack-free property because the photosensitive resin composition, which is applied and dried, is sticky. Therefore, the photosensitive resin composition has problems in that a photomask is contaminated in radiating ultraviolet rays via the photomask, and circuit substrates should be hardly adherable to each other when the circuit substrates are staked on one another.

Meanwhile, in the ink composition for a solder resist disclosed in Patent Literature 2, polymer particles at 20° C. or less of a glass transition temperature are dispersed. Therefore, the ink composition has an excellent tack-free property in a case where a film is applied. This makes it possible to suppress, to some extent, reduction in adhesion and/or peeling off of a cured film due to cracking and/or volumetric reduction. In a case where the ink composition is used as an insulating protective film of a flexible printed wiring board, however, the ink composition has problems in that a resultant insulating protective film has poor folding endurance and flame retardancy and is largely warped.

Solution to Problem

The inventors of the present invention have been diligently examined to solve the problems. As a result, the inventors obtained such a knowledge that (A) a photosensitive resin composition which (i) obtains an excellent tack-free property after being applied and dried, (ii) can be subjected to fine processing so as to have photosensitivity, (iii) prepare a cured film having excellent flexibility, flame retardancy, and electrical insulation reliability, and (iv) has small warpage after being cured, (B) a resin film, (C) an insulating film, and (D) an printed wiring board provided with an insulating film can be made from a photosensitive resin composition containing at least: (A) a binder polymer; (B) cross-linked polymer particles, whose polymer has a urethane bond in its molecule; (C) thermosetting resin; and (D) a photo-polymerization initiator. Based on the knowledge, the inventors achieved the present invention. The present invention can solve the above problems by using a photosensitive resin composition having a new feature below.

That is, the present invention provides a photosensitive resin composition containing at least: (A) a binder polymer; (B) cross-linked polymer particles, whose polymer has a urethane bond in its molecule; (C) thermosetting resin; and (D) a photo-polymerization initiator.

Advantageous Effects of Invention

As described above, a photosensitive resin composition of the present invention contains at least: (A) a binder polymer; (B) cross-linked polymer particles, whose polymer has a urethane bond in its molecule; (C) thermosetting resin; and (D) a photo-polymerization initiator, so that the photosensitive resin composition of the present invention (i) obtains an excellent tack-free property after being applied and dried, (ii) can be subjected to fine processing so as to have photosensitivity, (iii) prepare a cured film having excellent flexibility, flame retardancy, and electrical insulation reliability, and (iv) has small warpage after being cured. Accordingly, the photosensitive resin composition of the present invention can be used for protective films etc. of various circuit substrates, and yields an excellent effect.

BRIEF DESCRIPTION OF DRAWINGS

FIG. 1 is a schematic view of measurement of a warpage amount of a film.

DESCRIPTION OF EMBODIMENTS

Hereinafter, the present invention will describe, in detail, (I) a photosensitive resin composition and (II) a method for using the photosensitive resin composition in this order. Note that, in a case where the description in forms of "A-B" is written in this specification, the description means "A or more but B or less".

(I) Photosensitive Resin Composition

A photosensitive resin composition of the present invention is a photosensitive resin composition containing at least: (A) a binder polymer; (B) cross-linked polymer particles, whose polymer has a urethane bond in its molecule; (C) thermosetting resin; and (D) a photo-polymerization initiator.

The inventors of the present invention found that the photosensitive resin composition of the present invention had excellent various properties, and presume that reasons of this are specifically as follows: (i) a cross-linked polymer particle having a urethane bond in its molecule, which is a component (B), causes an applied film to have a rough surface, so that a resultant film has an excellent tack-free property after the film is applied and dried; and (ii) the cross-linked polymer particle having a urethane bond in its molecule has a urethane bond and is therefore soft, so that a cured film, which is obtained by curing the photosensitive resin composition, does not lose flexibility. The component (B) has excellent heat resistance and chemical resistance because the component (B) has a cross-linking structure. If a filler component is highly filled, a cured film generally loses flexibility that is required to endure repeated bending. Surprisingly, however, a cured film which is prepared by combining the component (A) with the component (B) becomes remarkably soft to thereby obtain an excellent folding endurance. The inventors of the present invention presume that a reason of this is as follows: the component (A) forming a matrix of the cured film is soaked into the component (B), so that the component (A) and the component (B) can obtain a high adhesiveness at an interface therebetween.

The following description will discuss (A) a binder polymer, (A1) resin having a urethane bond in its molecule, (A2) resin having an imide group in its molecule, (A3) resin having a (meth)acryloyl group in its molecule, and (A4) resin having a carboxyl group in its molecule, (B) a cross-linked polymer particle having a urethane bond in its molecule, (C) thermosetting resin, (D) a photo-polymerization initiator, (E) a phosphoric flame retardant, and other components. The following description will also discuss a method of mixing the photosensitive resin composition.

<(A) Binder Polymer>

The (A) binder polymer of the present invention is a polymer which is soluble in an organic solvent and has a weight-average molecular weight of 1,000 or more but 1,000,000 or less based on polyethylene glycol.

The above organic solvent is not particularly limited, and examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, those organic polar solvents may be combined with aromatic hydrocarbon such as xylene or toluene as necessary.

Further examples of the organic solvent encompass: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Organic solvent solubility, which is a barometer of solubility in an organic solvent, can be measured as parts by weight of a base polymer dissolved in 100 parts by weight of an organic solvent. If the parts by weight of the base polymer dissolved in the organic solvent (100 parts by weight) is 5 parts by weight or more, the base polymer is determined to be soluble in the organic solvent. A method of measuring the organic solvent solubility is not particularly limited. There can be employed, for example, such a method that: 5 parts by weight of a base polymer is added to 100 parts by weight of an organic solvent; the mixture is agitated for one hour at 40° C.; the mixture is cooled to a room temperature and let stand for more than 24 hours; and a resultant solution is confirmed to become a homogeneous solution in which any insoluble matter or precipitate does not appear.

A weight-average molecular weight of the component (A) in accordance with the present invention can be measured by, for example, the following method.

(Measurement of Weight-Average Molecular Weight)
Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluent: 30 mM LiBr+20 mM H3PO4 in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol).

It is preferable to adjust the weight-average molecular weight within the above range because a resultant cured film obtains improved flexibility and chemical resistance. If the weight-average molecular weight is 1,000 or less, the flexibility or the chemical resistance might decrease. Meanwhile, if the weight-average molecular weight is 1,000,000 or more, viscosity of the photosensitive resin composition might increase.

A polymer which is contained in the component (A) of the present invention is not particularly limited. Examples of the polymer encompass polyurethane resin, poly(meth)acrylic-based resin, polyvinyl-based resin, polystyrene-based resin, polyethylene-based resin, polypropylene-based resin, polyimide-based resin, polyamide-based resin, polyacetal-based resin, polycarbonate-based resin, polyester-based resin, polyphenylene-ether-based resin, polyphenylene-sulfide-based resin, polyethersulfone-based resin, and polyetheretherketone-based resin. Those polymers can be used solely, or two or more thereof can be used in combination. It is particularly preferable that the component (A) contains polyurethane resin which is (A1) resin having a urethane bond in its molecule. This is because a cured film, which is obtained by curing the photosensitive resin composition, obtains improved flexibility and folding endurance, and warpage of the cured film is reduced. It is preferable that the (A) component contains polyimide resin which is (A2) resin having an imide group in its molecule. This is because a cured film, which is obtained by curing the photosensitive resin composition, obtains improved heat resistance, flame retardancy, and electrical insulation reliability. It is preferable that the (A) component contains a polymer which is (A3) resin having a (meth)acryloyl group in its molecule. This is because the photosensitive resin composition obtains an improved photosensitivity, and a cured film, which is obtained by curing the photosensitive resin composition, obtains an improved chemical resistance. It is preferable that the (A) component contains a polymer which is (A4) resin having a carboxyl group in its molecule. This is because an alkali developability of the photosensitive resin composition is improved, and an adhesiveness between a cured film, which is obtained by curing the photosensitive resin composition, and a base material is improved.

<(A1) Resin Having Urethane Bond in Molecule>

The "resin having a urethane bond in its molecule" of the present invention is a polymer which (i) has repeating units having at least one urethane bond in its molecule and (ii) has a weight-average molecular weight of 1,000 or more but 1,000,000 or less based on polyethylene glycol.

It is preferable that the resin has a urethane bond in its molecule. This is because a cross-linked polymer particle, which is the component (B), has an urethane bond in its molecule and obtains oil absorptivity, so that the cross-linked polymer particle obtains a satisfactory affinity with resin having a urethane bond in its molecule forming a matrix of an applied film, and the resin having a urethane bond in its molecule is soaked into the cross-linked polymer particle from a surface thereof, and therefore the cross-linked polymer particle can obtains a high adhesiveness with a matrix.

The (A1) resin having a urethane bond in its molecule of the present invention can be obtained by an arbitrary reaction. For example, a diol compound which is represented by the following general formula (1):

[Chem. 1]

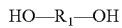  General formula (1)

(wherein $R_1$ represents a divalent organic group), and a diisocyanate compound which is represented by the following general formula (2):

[Chem. 2]

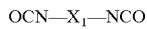  General formula (2)

(wherein $X_1$ represents a divalent organic group) are reacted with each other, and the (A1) resin having a urethane bond in its molecule has repeating units having a urethane bond which is represented by the following general formula (3):

General formula (3)

[Chem. 3]

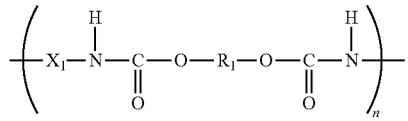

(wherein $R_1$ and $X_1$ independently represent a divalent organic group, and n represents an integer of 1 or more).

The diol compound of the present invention is not particularly limited, provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. Those compounds can be used solely, or two or more thereof can be used in combination.

It is particularly preferable to use a long chain diol, such as polyethylene glycol, polypropylene glycol, polytetramethylene glycol, polyoxyalkylene diol, polyester diol, polycarbonate diol, or polycaprolactone diol. This is because a cured film, which is obtained by curing the photosensitive resin composition, is reduced in elasticity, obtains an excellent flexibility, and has a small warpage.

The diisocyanate compound of the present invention is not particularly limited, provided that it has the above structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. Those compounds can be used solely, or two or more thereof can be used in combination.

It is particularly preferable to use an alicyclic diisocyanate compound and an aliphatic diisocyanate compound because the photosensitive resin composition obtains an excellent photosensitivity.

The (A1) resin having a urethane bond in its molecule in accordance with the present invention can be synthesized by the following method: specifically, a diol compound and a diisocyanate compound are mixed so that a ratio of the number of hydroxyl groups to the number of isocyanate groups is isocyanate groups/hydroxyl groups=0.5 or more but 2.0 or less; and the diol compound and an isocyanate compound are reacted with each other without using a solvent or with use of an organic solvent.

The (A1) resin having a urethane bond in its molecule of the present invention can be synthesized by using plural kinds of diol compounds and plural kinds of diisocyanate compounds. As a matter of course, the (A1) resin may be formed from a mixed compound in which a single kind of diol compound is mixed with plural kinds of diisocyanate compounds or vice versa.

In a case where two or more of the diol compounds are used, the two or more of the diol compounds may be reacted with the diisocyanate compound after the two or more of the diol compound are mixed, or each of the two or more of the diol compound may be independently reacted with the diisocyanate compound. Alternatively, the diol compound may be reacted with the diisocyanate compound in such a way that (i) a diol compound is initially reacted with the diisocyanate compound, (ii) a resultant terminal isocyanate compound is reacted with another diol compound, and (iii) a reactant is further reacted with the diisocyanate compound. In a case where two or more of the diisocyanate compound are used, the reaction can be carried out in the same way as described above. In this way, a desired (A1) resin having a urethane bond in its molecule can be prepared.

The reaction between the diol compound(s) and the diisocyanate compound(s) is carried out at a temperature of, preferably, 40 to 160° C., more preferably 60 to 150° C. If the temperature is less than 40° C., it takes too much time for the reaction. If the temperature exceeds 160° C., a three-dimensional reaction occurs during the reaction, which easily causes gelatinization. How long the reaction is carried out can be determined appropriately depending on a batch scale and a reaction condition to be employed. The reaction may be carried out in the presence of a catalyst such as tertiary amines or a metal or semi-metal compound (for example, alkaline metal, alkaline earth metal, tin, zinc, titanium, or cobalt) as necessary.

The above reaction can be carried out without any solvent. However, in order to control the reaction, it is preferable to carry out the reaction with use of an organic solvent. The organic solvent used herein is not particularly limited, and, for example, one of the above organic solvents can be used.

It is desirable that the organic solvent used in the reaction be added so that a solute concentration by weight in a reactant solution, i.e., a concentration of the reactant solution is 5% by weight or more but 90% by weight or less. The solute concentration by weight in the reactant solution is more desirably 10% by weight or more but 80% by weight or less. If the concentration of the reactant solution is less than 5% by weight, it is difficult to cause a polymerization reaction and a reaction speed decreases. This may result in that a desired structural substance cannot be prepared. For this reason, the concentration of 5% by weight or less is not preferable.

It is preferable that the (A1) resin having a urethane bond in its molecule has at least one organic group selected from the group consisting of the following (a1)-(a3): (a1) a (meth)acryloyl group; (a2) a carboxyl group; and (a3) an imide group. The (a1) (meth)acryloyl group means an acryloyl group and/or a methacryloyl group. In a case where the (A1) resin contains the (a1) (meth)acryloyl group, a resultant photosensitive resin composition obtains an improved photosensitivity. This makes it possible to cure the photosensitive resin composition by radiating the photosensitive resin composition with ultraviolet rays for a short time. In a case where the (A1) resin contains the (a2) carboxyl group, a resultant photosensitive resin composition obtains an improved solubility in a dilute alkaline aqueous solution serving as a developing solution. This makes it possible to form a fine pattern with a short-time development. In a case where the (A1) resin contains the (a3) imide group, a resultant photosensitive resin composition is improved in heat resistance and electrical insulation reliability under the condition of a high temperature and high humidity. It is therefore possible to prepare a highly-reliable printed wiring board by using the resultant photosensitive resin composition as a covering material for a printed wiring board.

The (A1) resin having (i) a urethane bond in its molecule and (ii) a (a1) (meth)acryloyl group can be obtained by an arbitrary reaction. For example, it is possible to prepare the (A1) resin by reacting a diol compound, a diisocyanate compound, and at least one of (A) a compound which has a hydroxyl group and at least one (meth)acryloyl group and is represented by the following general formula (4):

General formula (4)

[Chem. 4]

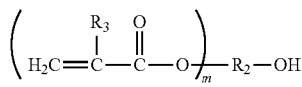

(wherein $R_2$ represents a (m+1) valent organic group, $R_3$ represents hydrogen or an alkyl group, and m represents an integer of 1 to 3) and (B) a compound which has an isocyanate group and at least one (meth)acryloyl group and is represented by the following general formula (5):

General formula (5)

[Chem. 5]

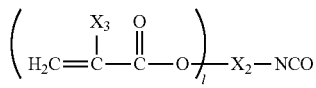

(wherein $X_2$ represents a (l+1) valent organic group, $X_3$ represents hydrogen or an alkyl group, and l represents an integer of 1 to 3).

The compound containing a hydroxyl group and at least one (meth)acryloyl group in accordance with the present invention is not particularly limited, provided that it has the above structure. Examples of the compound encompass 2-hydroxyethyl (meth)acrylate, 2-hydroxypropyl(meth) acrylate, 2-hydroxybutyl(meth)acrylate, 2-hydroxy-3-phenoxypropyl(meth)acrylate, 2-hydroxy-1-acryloxy-3-methacryloxy propan, o-phenylphenolglycidyl ether(meth) acrylate, polyethylene glycol mono(meth)acrylate, pentaerythritol tri(meth)acrylate, tris(2-hydroxyethyl)isocyanurate di(meth)acrylate, 1,4-cyclohexanedimethanol mono(meth)acrylate, 4-hydroxyphenyl (meth)acrylate, 2-(4-hydroxyphenyl)ethyl (meth)acrylate, N-methylolacrylamide, 3,5-dimethyl-4-hydroxybenzyl acrylamide. Those compounds can be used solely, or two or more thereof can be used in combination.

The compound containing an isocyanate group and at least one (meth)acryloyl group in accordance with the present invention is not particularly limited, provided that it has the above structure. Examples of the compound encompass 2-(meth)acryloyloxyethyl isocyanate, 1,1-bis (acryloyloxymethyl)ethyl isocyanate, 2-(2-methacryloyloxyethyloxy)ethyl isocyanate. Those compounds can be used solely, or two or more thereof can be used in combination.

The (A1) resin having (i) a urethane bond in its molecule and (ii) the (a2) carboxyl group can be obtained by an arbitrary reaction. For example, it is possible to prepare the (A1) resin by reacting a diol compound, a diisocyanate compound, and a compound which has two hydroxyl groups and one carboxyl group and is represented by the following general formula (6):

General formula (6)

[Chem. 6]

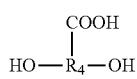

(wherein $R_4$ represents a trivalent organic group).

The compound having two hydroxyl groups and one carboxyl group in accordance with the present invention is not particularly limited, provided that it has the above structure. Examples of the compound encompass 2,2-bis (hydroxymethyl)propionic acid, 2,2-bis(2-hydroxyethyl) propionic acid, 2,2-bis(3-hydroxymepropyl)propionic acid, 2,3-dihydroxy-2-methylpropionic acid, 2,2-bis(hydroxymethyl)butanoic acid, 2,2-bis(2-hydroxyethyl) butanoic acid, 2,2-bis(3-hydroxypropyl)butanoic acid, 2,3-dihydroxybutanoic acid, 2,4-dihydroxy-3,3-dimethylbutanoic acid, 2,3-dihydroxy hexadecanoic acid, 2,3-dihydroxy benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid. Those compounds can be used solely, or two or more thereof can be used in combination. It is particularly preferable to use an aliphatic-based compound having two hydroxyl groups and one carboxyl group because a resultant photosensitive resin composition has an excellent photosensitivity.

The (A1) resin having (i) a urethane bond in its molecule and (ii) the (a3) imide group can be obtained by an arbitrary reaction. For example, it is possible to prepare the (A1) resin by reacting a diol compound, a diisocyanate compound, tetracarboxylic acid dianhydride represented by the following general formula (7):

General formula (7)

[Chem. 7]

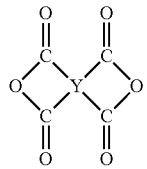

(wherein Y represents a quadrivalent organic group).

Tetracarboxylic acid dianhydride of the present invention is not particularly limited, provided that it has the above structure. Examples of tetracarboxylic acid dianhydride encompass 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride. Those kinds of tetracarboxylic acid dianhydride can be used alone, or two or more kinds thereof can be used in combination.

<(A2) Resin Having Imide Group in Molecule>

The "(A2) resin having an imido group in its molecule" of the present invention is a polymer which (i) has repeating units having at least one imido group in its molecule and (ii) has a weight-average molecular weight of 1,000 or more but 1,000,000 or less based on polyethylene glycol.

The (A2) resin having an imide group in its molecule in accordance with the present invention can be obtained by an arbitrary reaction. For example, it is possible to prepare the (A2) resin by a method similar to the method of preparing the (A1) resin having (i) a urethane bond in its molecule and (ii) the (a3) imide group.

In addition to the above method, it is possible to prepare the (A2) resin by reacting the tetracarboxylic acid dianhydride, which is represented by the above general formula (7), and a diamino compound which is represented by the following general formula (8):

[Chem. 8]

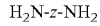 General formula (8)

(wherein Z represents a divalent organic group).

The diamino compound of the present invention is not particularly limited, provided that it has the above structure.

Examples of the diamino compound encompass: diamino phenols such as m-phenylenediamine, o-phenylenediamine, p-phenylenediamine, m-aminobenzylamine, p-aminobenzylamine, bis(3-aminophenyl)sulfide, (3-aminophenyl)(4-aminophenyl) sulfide, bis(4-amino phenyl) sulfide, bis(3-aminophenyl) sulfoxide, (3-aminophenyl)(4-aminophenyl) sulfoxide, bis(4-aminophenyl) sulfoxide, bis(3-aminophenyl) sulfone, (3-aminophenyl)(4-aminophenyl)sulfone, bis(4-aminophenyl) sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis[4-(3-aminophenoxy)phenyl]sulfoxide, bis[4-(aminophenoxy)phenyl]sulfoxide, (4-aminophenoxyphenyl) (3-aminophenoxyphenyl)phenyl]sulfoxide, bis[4-(3-aminophenoxy)phenyl]sulfone, bis[4-(4-aminophenoxy)phenyl]sulfone, (4-aminophenoxyphenyl) (3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl]methane, bis[4-(4-aminophenoxy)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl)]ethane, 1,2-bis[4-(3-aminophenoxy) phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1, 1,1, 3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxy)phenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2', 5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis (hydroxyphenoxy)biphenyl compounds such as 4,4'-bis(4-amino-3-hydroxyphenoxy) biphenyl; bis[(hydroxyphenoxy) phenyl]sulfone compounds such as 2,2-bis[4-(4-amino-3- hydroxyphenoxy)phenyl]sulfone; and bis(hydroxyphenoxy) biphenyl compounds such as 4,4'-diamino-3,3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. Those compounds can be used solely, or two or more thereof can be used in combination.

A reaction between tetracarboxylic acid anhydride and a diamino compound can be carried out by an arbitrary method. For example, it is possible to carry out the reaction by the following method.

Method 1: A solution is prepared in advance by dispersing or dissolving tetracarboxylic acid dianhydride into an organic solvent, and then a diamino compound is added to the solution so as to react the diamino compound with the solution. Thus a polyamide acid solution is prepared. At this time, the diamino compound is added so that a total added amount of the diamino compound is 0.50 mol to 1.50 mol with respect to 1 mol of tetracarboxylic acid dianhydride. After a reaction between tetracarboxylic acid dianhydride and the diamino compound is finished, a resultant polyamide acid solution is imidized by heating the resultant polyamide acid solution at 100° C. or more but 300° C. or less, and more preferably, at 150° C. or more but 250° C. or less.

Method 2: A polyamide acid solution is prepared in the same way as the method 1. An imidization catalyst (tertiary amine such as pyridine, picoline, isoquinoline, trimethylamine, triethylamine, or tributhylamine is preferably used) and a dehydrating agent (acetic anhydride or the like) are added to the polyamide acid solution, are heated to 60° C. or more but 180° C. or less, thereby being subjected to imidization.

Method 3: A polyamide acid solution is prepared in the same way as the method 1. The polyamide acid solution thus prepared is put into a vacuum oven which has been heated to a temperature of 100° C. or more but 250° C. or less, and is subjected to imidization by heating and drying the polyamide acid solution in the vacuum oven under vacuum.

<(A3) Resin Having (meth)acryloyl Group in Molecule>

The "(A3) resin having a (meth)acryloyl group in its molecule according to the present invention is a polymer which (i) has at least one (meth)acryloyl group in its molecule and (ii) has a weight-average molecular weight of 1,000 or more but 1,000,000 or less based on polyethylene glycol.

The (A3) resin having a (meth)acryloyl group in its molecule in accordance with the present invention can be obtained by an arbitrary reaction. For example, it is possible to prepare the (A3) resin by a method similar to the method of preparing the (A1) resin having (i) a urethane bond in its molecule and (ii) the (a1) (meth)acryloyl group.

In addition to the above method, the (A3) resin can be obtained by reacting epoxy resin with a (meth)acrylic acid.

Epoxy resin of the present invention is not particularly limited. Examples of bisphenol A epoxy resin encompass: jER828, jER1001, and jER1002 (trade name) manufactured by Japan Epoxy Resins Co., Ltd.; ADEKA RESIN EP-4100E and ADEKA RESIN EP-4300E (trade name) manufactured by ADEKA CORPORATION, RE-310S and RE-410S (trade name) manufactured by Nippon Kayaku Co., Ltd.; EPICLON 840S, EPICLON 850S, EPICLON 1050, and EPICLON 7050 (trade name) manufactured by DIC Corporation; and Epotote YD-115, Epotote YD-127, and Epotote YD-128 (trade name) manufactured by Tohto Kasei Co., Ltd. Examples of bisphenol F epoxy resin encompass: jER806 and jER807 (trade name) manufactured by Japan Epoxy Resins Co., Ltd.; ADEKA RESIN EP-4901E and ADEKA RESIN EP-4930, and ADEKA RESIN EP-4950 (trade name) manufactured by ADEKA CORPORATION; RE-303S, RE-304S, RE-403S, and RE-404S, (trade name) manufactured by Nippon Kayaku Co., Ltd.; and EPICLON 830 and EPICLON 835 (trade name) manufactured by DIC Corporation; Epotote YDF-170, Epotote YDF-175S, and Epotote YDF-2001 (trade name) manufactured by Tohto Kasei Co., Ltd. Examples of bisphenol S epoxy resin encompass: EPICLON EXA-1514 (trade name) manufactured by DIC Corporation. Examples of hydrogenated bisphenol A epoxy resin encompass: jERYX8000, jERYX8034, and jERYL7170 (trade name) manufactured by Japan Epoxy Resins Co., Ltd.; ADEKA RESIN EP-4080E (trade name) manufactured by ADEKA CORPORATION; EPICLON EXA-7015 (trade name) manufactured by DIC Corporation; Epotote YD-3000, and Epotote YD-4000D (trade name) manufactured by Tohto Kasei Co., Ltd. Examples of biphenyl epoxy resin encompass: jERYX4000, jERYL6121H, jERYL6640, and jERYL6677 (trade name) manufactured by Japan Epoxy Resins Co., Ltd.; and NC-3000 and NC-3000H (trade name) manufactured by Nippon Kayaku Co., Ltd. Examples of phenoxy epoxy resin encompass: jER1256, jER4250, and jER4275 (trade name) manufactured by Japan Epoxy Resins Co., Ltd. Examples of naphthalene epoxy resin encomapss EPICLON HP-4032, EPICLON HP-4700, and EPICLON HP-4200 (trade name) manufactured by DIC Corporation; and NC-7000L (trade name) manufactured by Nippon Kayaku Co., Ltd. Examples of phenol novolac epoxy resin encompass jER152 and jER154 (trade name) manufactured by Japan Epoxy Resins Co., Ltd.; EPPN-201-L (trade name) manufactured by Nippon Kayaku Co., Ltd.; EPICLON N-740 and EPICLON N-770 (trade name) manufactured by DIC Corporation; Epotote YDPN-638 (trade name) manufactured by Tohto Kasei Co., Ltd. Examples of cresol novolac epoxy resin encompass EOCN-1020, EOCN-102S, EOCN-103S, and EOCN-104S (trade name) manufactured by Nippon Kayaku Co., Ltd.; and EPICLON N-660, EPICLON N-670, EPICLON N-680, and EPICLON N-695 (trade name) manufactured by DIC Corporation. Examples of trisphenol methan epoxy resin emcompass EPPN-501H, EPPN-501HY, and EPPN-502H (trade name) manufactured by Nippon Kayaku Co., Ltd. Examples of dicyclopentadiene epoxy resin encompass: XD-1000 (trade name) manufactured by Nippon Kayaku Co., Ltd.; and EPICLON HP-7200 (trade name) manufactured by DIC Corporation. Examples of amine epoxy resin emcompass: jER604 and jER630 (trade name) manufactured by Japan Epoxy Resins Co., Ltd.; Epotote YH-434 and Epotote YH-434L (trade name) manufactured by Tohto Kasei Co., Ltd.; and TETRAD-X, TERRAD-C (trade name) manufactured by MITSUBISHI GAS CHEMICAL COMPANY, INC. Examples of flexible epoxy resin encompass: jER871, jER872, jERYL7175, and jERYL7217 (trade name) manufactured by Japan Epoxy Resins Co., Ltd.; and EPICLON EXA-4850 (trade name) manufactured by DIC Corporation. Examples of urethane modified epoxy resin encompass, ADEKA RESIN EPU-6, ADEKA RESIN EPU-73, and ADEKA RESIN EPU-78-11 (trade name) manufactured by ADEKA CORPORATION. Examples of rubber modified epoxy resin encompass: ADEKA RESIN EPR-4023, ADEKA RESIN EPR-4026, and ADEKA RESIN EPR-1309 (trade name) manufactured by ADEKA CORPORATION. Examples of chelate modified epoxy resin encompass ADEKA RESIN EP-49-10 and ADEKA RESIN EP-49-20 (trade name) manufactured by ADEKA CORPORATION. Examples of heterocycle-containing epoxy resin encompass TEPIC (trade name) manufactured by Nissan Chemical Industries, Ltd. Those resins can be used solely, or two or more thereof can be used in combination.

A reaction between epoxy resin and a (meth)acrylic acid can be carried out by an arbitrary method. For example, it is possible to carry out the reaction in such a way that a solution is prepared in advance by dispersing or dissolving epoxy resin into an organic solvent and heating the solution thus prepared to 40° C. or more but 120° C. or less so as to react the epoxy resin with the (meth)acrylic acid. In this case, a (meth)acrylic acid and an esterification catalyst (tertiary amine such as trimethylamine, triethylamine, triphenylphosphine which is a phosphorus compound, or 2-ethyl-4-methyl imidazole which is an imidazole compound is preferably used) are added to the solution. Thus, an epoxy (meth)acrylate resin solution is prepared. At this time, the (meth)acrylic acid is added so that a total added amount of (meth)acrylic acid is 0.1 mol to 1.0 mol with respect to 1 mol of an epoxy group of the epoxy resin.

<(A4) Resin Having Carboxyl Group in Molecule>

The "(A4) resin having a carboxyl group in its molecule" of the present invention is a polymer which (i) has at least one carboxyl group in its molecule and (ii) has a weight-average molecular weight of 1,000 or more but 1,000,000 or less based on polyethylene glycol.

The (A4) resin having a carboxyl group in its molecule in accordance with the present invention can be obtained by an arbitrary reaction. For example, it is possible to prepare the (A4) resin by a method similar to the method of preparing the (A1) resin having (i) a urethane bond in its molecule and (ii) the (a2) carboxyl group.

In addition to the above method, the (A4) resin can be obtained by reacting a (meth)acrylic acid with a (meth) acrylic acid ester derivative.

The reaction between the (meth)acrylic acid and (meth)acrylic acid ester in accordance with the present invention can be carried out by an arbitrary method. For example, the (A4) resin can be obtained by reacting a (meth)acrylic acid and/or a (meth)acrylic acid ester derivative with each other in a solvent under the presence of a radical polymerization initiator.

A (meth)acrylic acid ester derivative of the present invention is not particularly limited. Examples of the (meth) acrylic acid ester derivative encompass: methyl (meth)acrylate, ethyl (meth)acrylate, butyl (meth)acrylate, isobutyl (meth)acrylate, tertiary butyl (meth)acrylate, hexyl (meth)acrylate, 2-ethylhexyl (meth)acrylate, octyl (meth)acrylate, nonyl (meth)acrylate, decyl (meth)acrylate, dodecyl (meth)acrylate, stearyl (meth)acrylate, and benzyl (meth)acrylate. Those (meth)acrylic acid ester derivatives can be used solely, or two or more thereof can be used in combination. Among those (meth)acrylic acid ester derivatives, it is particularly preferable to use methyl (meth)acrylate, ethyl (meth)acrylate, and butyl (meth)acrylate so that a cured film made from a photosensitive resin composition obtain a flexibility and a chemical resistance.

Examples of the radical polymerization initiator encompass: azo-based compounds such as azobisisobutyronitrile, azobis(2-methylbutyronitrile), and 2,2'-azobis-2,4-dimethylvaleronitril; organic peroxides such as t-butyl hydroperoxide, cumene hydroperoxide, benzoyl peroxide, dicumyl peroxide, and di-t-butyl perodxide; and persulfates such as potassium persulfate, sodium persulfate, and ammonium peroxodisulfate; and hydrogen peroxide. Those radical polymerization initiators can be used solely, or two or more thereof can be used in combination.

A usage amount of the radical polymerization initiator is preferably 0.001 part by weight to 5 parts by weight with respect to 100 parts by weight of monomer to be used, and more preferably 0.01 part by weight to 1 part by weight. If the usage amount of the radical polymerization initiator is less than 0.001 part by weight, the reaction does not smoothly progress. Meanwhile, if the usage amount of the radical polymerization initiator is more than 5 parts by weight, a molecular weight thereof is reduced in some cases.

It is preferable that an amount of the solvent for use in the above reaction be determined so that a solute concentration by weight in a reacted solution, i.e., a concentration of the reacted solution is 5% by weight or more but 90% by weight or less, and more preferably 20% by weight or more but 70% by weight or less. If the concentration of the reacted solution is less than 5%, a polymerization reaction would be difficult to take place, and a reaction rate might become slow, and in addition, a desired structured-material might not be prepared. Further, if the concentration of the solution is more than 90% by weight, a reacted solution becomes highly viscous in some cases, which results in an ununiformal reaction.

A reaction temperature of the reaction is preferably set to 20° C. to 120° C., and more preferably 50° C. to 100° C. If the temperature is less than 20° C., a reaction time becomes too long. Meanwhile, if the temperature exceeds 120° C., the reaction may be too rapidly progressed or gelling may be caused by three-dimensional cross-linking in accordance with a side reaction. The reaction time can be appropriately selected in accordance with a magnitude of a batch and/or an employed reaction condition.

<(B) Cross-Linked Polymer Particle Having Urethane Bond in Molecule>

The "(B) cross-linked polymer particle having a urethane bond in its molecule" of the present invention is a spherical polymer which has at least one urethane bond and cross-linking structure in its molecule and whose average particle diameter is 1 µm to 100 µm. The term "spherical" encompass a true spherical shape and an oval shape. If the average particle diameter is less than 1 µm, the viscosity and thixotropy of the photosensitive resin composition becomes high. This may, in some cases, cause foaming of a material of an applied film at the time of applying the film, or poor appearance due to shortage of leveling. Meanwhile, if the average particle diameter is more than 100 µm, a particle might be exposed at an opening when a fine pattern is formed, and therefore a resolution might be decreased.

It is preferable that an average particle diameter of the component (B) of the present invention is preferably 1 µm to 50 µm, and more preferably 1 µm to 20 µm because the resolution of the fine pattern is improved, and a resultant cured film obtains excellent flexibility and chemical resistance.

The average particle diameter of the component (B) of the present invention can be measured, as a median size based on volume (which is a particle diameter with respect to 50% of a value of cumulative size distribution), by the following method, for example.

(Measurement of Average Particle Diameter)

Device: Counterpart of LA-950V2 manufactured by HORIBA, Ltd.

Measurement method: laser diffraction/scattering.

An amount of oil absorption of the component (B) in accordance with the present invention can be measured, for example, by a boiled linseed oil method, defined in JIS K 5101-13-2, in which the amount of oil absorption is indicated as boiled linseed oil (ml) with respect to 100 g of particles. The amount of oil absorption of the component (B) is preferably 50 ml/100 g or more because the component (B) can firmly adhered to a matrix. If the amount of oil absorption is less than 50 ml/100 g, permiation of a matrix component to particles is insufficient and therefore adhesiveness of interfaces is poor, and a resultant cured film may be reduced in flexibility. An upper limit of the amount of oil absorption is not particularly limited. If, however, the amount of oil absorption is more than 500 ml/100 g, the viscosity of the photosensitive resin composition becomes high. This may, in some cases, cause foaming of a material of an applied film at the time of applying the film or poor appearance due to shortage of leveling. Accordingly, it is particularly preferable that the amount of oil absorption of the component (B) is 50 ml/100 g or more but 500 ml/100 g or less.

A content of the component (B) in accordance with the present invention is preferably 30 parts by weight to 100 parts by weight, and more preferably 40 parts by weight to 80 parts by weight, with respect to 100 parts by weight of the component (A). This makes it possible to effectively cause a resultant cured film to have a rough surface. Therefore, the resultant cured film obtains an excellent tack-free property. In addition, the resultant cured film has a small warpage because of a filling effect by the component (B), and is improved in flexibility which is capable of enduring repeated folding because a stress relaxation effect and a fracture toughness are improved. If the component (B) is less than 30 parts by weight, the tack-free property and the flexibility capable of enduring repeated folding may be deteriorated in some cases. Meanwhile, if the component (B) is more than 100 parts by weight, the flame retardancy and a coating property at the time of applying a photosensitive resin composition solution may be deteriorated. This may, in some cases, cause foaming of a material of an applied film at the time of applying the film, or poor appearance due to shortage of leveling.

The component (B) of the present invention is not particularly limited, provided that it has the above structure. Examples of the component (B) encompass: DAIMIC BEAZ UCN-8070CM clear, UCN-8150CM clear, UCN-5070D clear, and UCN-5150D clear (trade name), manufactured by Dainichiseika Color & Chemicals Mfg. Co., Ltd.; and Art Pearl C-100 clear, C-200 clear, C-300 clear, C-300WA, C-400 clear, C-400WA, C-600 clear, C-800 clear, C-800WA, P-400T, P-800T, U-600T, CF-600T, JB-400T, JB-800T, CE-400T, CE-800T, and MM-120T (trade name), manufactured by Negami chemical industrial co., ltd. Those components can be used solely, or two or more thereof can be used in combination.

<(C) Thermosetting Resin>

The "(C) thermosetting resin" of the present invention is a compound having at least one thermosetting organic group in its molecule.

The component (C) of the present invention is not particularly limited, provided that it has the above structure. Examples of the component (C) encompass: epoxy resin; oxetane resin; phenol resin; isocyanate resin; block isocyanate resin; bismaleimide resin; bisallylnadiimide resin; polyester resin (e.g., unsaturated polyester resin); diallylphthalate resin; silicon resin; venylester resin; melamine resin; polybismaleimide triazine resin (BT resin); cyanate resin (e.g., cyanate ester resin); urea resin; guanamine resin; sulfonamide resin; aniline resin; polyurea resin; thiourethane resin; polyazomethine resin; episulphide resin; enethiol resin; benzoxazine resin; copolymer resins thereof; modified resins thereof, which are prepared by modifying those resins; and mixtures of those resins or mixtures of one or more resins with (an)other resin(s).

Among the above thermosetting resins, it is particularly preferable to use polyfunctional epoxy resin as the component (C) of the present invention. This is because a resultant cured film, which is prepared by curing a photosensitive resin composition, obtains not only a heat resistance, but also an adhesiveness with a conductor (such as metallic foil) or a circuit substrate.

The polyfunctional epoxy resin is a compound having at least two epoxy groups in its molecule, and is not particularly limited. For example, the above examples cited as the epoxy resin can be used as the polyfunctional epoxy resin.

A curing agent of the thermosetting resin which is contained in the photosensitive resin composition of the present invention is not particularly limited. Examples of the curing agent encompass: phenol resins such as phenol novolac resin, cresol novolac resin, and naphthalene phenol resin; amino resin; urea resin; melamine; and dicyandiamide. Those curing agents can be used solely, or two or more thereof can be used in combination.

A curing accelerator which is contained in the photosensitive resin composition of the present invention is not particularly limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. Those curing accelerators can be used solely, or two or more thereof can be used in combination.

<(D) Photo-Polymerization Initiator>

The (D) photopolymerization initiator of the present invention is a compound that is activated by energy of UV or the like, and initiates and promotes a reaction of a radical polymerizable group.

The (D) photopolymerization initiator is not particularly limited provided that it has the above structure. Examples of the (D) photopolymerization initiator encompass Michler's ketone, 4,4'-bis(diethylamino)benzophenone, 4,4', 4"-tris (dimethylamino)triphenylmethane, 2,2'-bis(2-chlorophenyl)-4,4',5, 5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1- phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1-one, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanedione, 1-[4-(phenylthio)-,2-(O-benzoyloxime)], iodonium, (4-methylphenyl) [4-(2-methylpropyl)phenyl]-hexafluorophosphate(1-), ethyl-4-dimethylaminobenzoate, 2-ethylhexyl-4-dimethylaminobenzoate, ethanone, and 1-[9-ethyl-6-(2-methylbenzoyl)-9H-carbazol-3-yl]-1-(O-acetyloxime).

These photopolymerization initiators can be used solely, two or more thereof can be used in combination.

<(E) Phosphorous Flame Retardant>

The (E) phosphorous flame retardant of the present invention is a compound that contains at least one elemental phosphorus in its molecule and has an effect of suppressing burning of organic matter.

The component (E) of the present invention is not particularly limited provided that it has the above structure. Examples of the component (E) encompass red phosphorus, a condensed phosphoric ester compound, a cyclic organic phosphorus compound, a phosphazene compound, a phosphorus-containing (meth)acrylate compound, a phosphorus-containing epoxy compound, a phosphorus-containing polyol compound, a phosphorus-containing amine compound, polyphosphate ammonium, melamine phosphate, and phosphinate. These components can be used solely, or two or more thereof can be used in combination.

It is particularly preferable to use, as the component (E) of the present invention, phosphinate among the above phosphorous flame retardants. This is because use of phosphinate makes it possible to impart excellent flame retardancy to a cured film obtained by curing a photosensitive resin composition and also makes it possible to reduce bleeding out of a flame retardant from the cured film to thereby suppress failure at a connection point and contamination in a manufacturing process.

Phosphinate of the present invention is a compound represented by the following general formula (9).

General formula (9)

[Chem. 9]

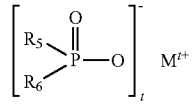

(wherein $R_5$ and $R_6$ each independently represent a linear or branched $C_1$-$C_6$ alkyl or aryl group, M represents at least one metal selected from the group consisting of Mg, Ca, Al, Sb, Sn, Ge, Ti, Fe, Zr, Zn, Ce, Bi, Sr, Mn, Li, Na, and K, and t is an integer of 1 to 4.).

Phosphinate of the present invention is not particularly limited provided that it has the above structure. Examples of phosphinate encompass aluminum tris(diethyl phosphinate), aluminum tris(methylethyl phosphinate), aluminum tris(diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), and titanyl bis(diphenyl phosphinate).

These phosphinates can be used solely, or two or more thereof can be used in combination. Particularly, aluminum tris(diethylphosphinate) and aluminum tris(methylethyl phosphinate) are preferable because use of them makes it possible to obtain a high flame retardancy.

A content of the component (E) of the present invention is preferably 5 to 100 parts by weight, more preferably 10 to 50 parts by weight relative to 100 parts by weight of the component (A). This makes it possible to improve flame retardancy and electrical insulation reliability of a cured film obtained. In a case where the content of the component (E) is less than 5 parts by weight, the cured film may have poor flame retardancy. If the content of the component (E) is more than 100 parts by weight, the folding endurance may be deteriorated, or a coating property at the time of applying a photosensitive resin composition solution may be deteriorated, which results in causing, in some cases, foaming of a material of an applied film at the time of applying the film, or poor appearance due to shortage of leveling.

<Other Components>

The photosensitive resin composition of the present invention can further contain, as necessary, various additives such as a radical polymerizable compound, a filler, an adhesion promoting agent, a defoaming agent, a leveling agent, a coloring agent, and a polymerization inhibitor.

The radical polymerizable compound is a compound containing, in its molecule, radical polymerizable group which has been polymerized by a radical polymerization initiator. Particularly, a radical polymerizable compound having at least one unsaturated double bond in its molecule is preferable. Further, the unsaturated double bond is preferably a (meth)acryloyl group or a vinyl group.

It is preferable that the radical polymerizable compound be used in a case where the (A) binder polymer does not have a (meth)acryloyl group. As a matter of course, however, the radical polymerizable compound may be used even in a case where the (A) binder polymer has a (meth)acryloyl group.

Examples of the radical polymerizable compound encompass: bisphenol F EO-denatured (n=2 to 50) diacrylate, bisphenol A EO-denatured (n=2 to 50) diacrylate, bisphenol S EO-denatured (n=2 to 50) diacrylate, bisphenol F EO-denatured (n=2 to 50) dimethacrylate, bisphenol A EO-denatured (n=2 to 50) dimethacrylate, bisphenol S EO-denatured (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane; 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy) phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3-5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. Those compounds can be used solely, or two or more thereof can be used in combination. It is particularly preferable to use diacrylate or dimethacrylate having 2 to 50 mol of repeating units of EO (ethylene oxide) in its molecule. This is because a solubility of the photosensitive resin composition in an aqueous developing solution, which is typically represented by an alkaline aqueous solution, is improved, and the developing time is reduced.

Example of the filler encompass fine inorganic fillers such as silica, mica, talc, barium sulfate, wollastonite, and calcium carbonate.

Examples of the defoaming agent encompass acryl-based compounds, vinyl-based compounds, and butadiene-based compounds.

The leveling agent to be contained may be, for example, an acryl-based compound or a vinyl-based compound.

The coloring agent to be contained may be a phthalocyanine-based compound, an azo-based compound, carbon black, or the like.

The adhesion promoting agent (also called a adhesion promoter) to be contained may be a silane coupling agent, a triazole-based compound, a tetrazole-based compound, a triazine-based compound, or the like.

The polymerization inhibitor to be contained may be hydroquinone, hydroquinone monomethylether or the like.

The photosensitive resin composition of the present invention may contain a flame retardant to obtain a higher flame retardant effect. The flame retardant to be contained may be, for example, a halogen-based compound, a metal hydroxide, and a melamine-based compound. Those various additives can be used solely, or two or more thereof can be used in combination.

<Method of Mixing Photosensitive Resin Composition>

It is possible to prepare the photosensitive resin composition of the present invention by grinding-dispersing the components (A) through (E) and (an)other component(s) and then mixing them. A method of grinding-dispersing those components is not particularly limited, and is carried out with use of, for example, a general mixing device such as a beads-mill, a ball mill, or a triple-roll mill. It is particularly preferable to use the beads-mill to grind-disperse the components to mix them because a particle size distribution of the component (B), which exists as fine particles, becomes uniform.

For example, the beads-mill is used to grind-disperse fine particles to mix the fine particles with other components as follows: the components (A)-(E), (an)other component(s), and a solvent as necessary are mixed with each other; the mixture is mixed with beads; the mixture is then agitated with use of a predetermined device; and the mixture is shore. Thus, fine particles can be ground-dispersed to thereby be mixed with each other. The kinds of the beads to be used are, for example, zirconia, zircon, glass, and titania, however, there may be used beads which have a target particle diameter and is suitable for an intended use. A particle diameter of beads may be determined so as to be suitable for a target particle diameter of the component (B), and is not particularly limited. An agitating speed (circumferential speed) changes in accordance with a device to be used, however, the mixture may be agitated at a rate of 100 rpm to 3000 rpm. If the agitating speed becomes higher, a temperature of the mixture is raised, so that such temperature raise may be suppressed by flowing cooling water or a coolant as appropriate. When the component (B) obtains a desired particle diameter, then beads are filtered. Thus the photosensitive resin composition of the present invention can be prepared. It is possible to measure a particle diameter of the fine particles by a method with use of a gauge which is defined by JIS K 5600-2-5. It is also possible to measure an average particle diameter, a particle diameter, and a particle size distribution in a case of using a particle size distribution measurement device.

(II) Method of Using Photosensitive Resin Composition

The photosensitive resin composition of the present invention can be directly formed into a cured film or a relief pattern, or can be formed into a cured film or a relief pattern after the photosensitive resin composition solution is prepared as follows. Initially, the photosensitive resin composition or the photosensitive resin composition solution is applied to a substrate. Alternatively, the photosensitive resin composition solution is applied to a substrate, and is dried so as to remove an organic solvent. The application of the photosensitive resin composition or the photosensitive resin composition solution to the substrate may be carried out by screen printing, curtain rolling, reverse rolling, spray coating, rotational application by use of a spinner, or the like. An applied film (having a thickness of preferably 5 μm to 100 μm, particularly preferably 10 μm to 100 μm) is dried at 120° C. or less, preferably at 40° C. to 100° C.

After the applied film is dried, a negative photomask is placed on the applied film thus dried, and is irradiated with active light such as ultraviolet rays, visible light, or electron beams. Then, a portion, in the applied film, which is not exposed to light is washed with a developing solution by a method such as a shower method, a paddle method, a soaking method, an ultrasonic method, or the like method so as to form a relief pattern. Since a time required for the pattern to be exposed differs depending on (i) a spray pressure and a flow speed of the developing device and (ii) a temperature of the etching solution, it is preferable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds for use in preparation of the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Further, any other compounds are obviously usable as long as the aqueous solution exhibits basicity. The alkaline compound that is preferably used in the step of developing the photosensitive resin composition of the present invention has a concentration of preferably 0.01% to 20% by weight, particularly preferably 0.02% to 10% by weight. A temperature of the developing solution depends on a composition of the photosensitive resin composition and a composition of the developing solution. Generally, the temperature of the developing solution is preferably 0° C. or more but 80° C. or less, more preferably 10° C. or more but 60° C. or less.

The relief pattern thus formed in the developing step is rinsed to remove unnecessary residues of the developing solution. Examples of a rinsing fluid for use in the rinse encompass water and an acidic aqueous solution.

Next, the relief pattern thus obtained is subjected to a heat treatment. By carrying out the heat treatment, and then reacting residual reactive groups with each other in a molecular structure, it is possible to prepare a cured film having excellent heat resistance. A thickness of the cured film is determined in consideration of a thickness of wiring lines and the like, but is preferably about 2 to 50 µm. As for a final curing temperature in the heat treatment, it is desirable that the film be cured by heating at low temperatures so as to prevent oxidization of the wiring lines and the like and a decrease in adhesiveness of the wiring lines to a base material.

The curing temperature at this time is preferably 100° C. or more but 250° C. or less, further preferably not less than 120° C. but not more than 200° C., particularly preferably not less than 130° C. but not more than 180° C. It is not preferable that a final heat temperature be high, because deterioration of the wiring lines due to oxidation is promoted.

A cured film formed from the photosensitive resin composition of the present invention has an excellent flexibility, flame retardancy, and electrical insulation reliability, and a substrate upon curing has a small warpage.

Further, an insulating film obtainable from the photosensitive resin composition has a thickness of, preferably, about 2 µm to 50 µm. The insulating film upon photo-curing has a resolution of at least up to 10 µm, and in particular, a resolution of about 10 µm to 1000 µm. In view of this, the insulating film obtainable from the photosensitive resin composition is particularly suitable as an insulating material for a flexible substrate. Furthermore, the insulating film obtainable from the photosensitive resin composition is usable to various of photo-curable wiring coating protective agents, photosensitive heat-resistant adhesives, insulating coatings of an electric wire and cable, and the like.

In the present invention, it is also possible to provide a similar insulating material with use of a resin film obtained by applying, to a surface of a base material, the photosensitive resin composition or the photosensitive resin composition solution, and drying the solution thus applied.

The present invention can also be made as follows.

In the photosensitive resin composition of the present invention, it is preferable that the (A) binder polymer contains (A1) resin having a urethane bond in its molecule.

Further, in the photosensitive resin composition of the present invention, it is preferable that the (A1) resin having a urethane bond in its molecule has at least one organic group selected from the group consisting of the following (a1)-(a3): (a1) a (meth)acryloyl group; (a2) a carboxyl group; and (a3) an imide group.

Further, in the photosensitive resin composition of the present invention, it is preferable that the (A) binder polymer further contains (A2) resin having an imide group in its molecule.

Further, in the photosensitive resin composition of the present invention, it is preferable that the (A) binder polymer contains (A3) resin having a (meth)acryloyl group in its molecule.

Further, in the photosensitive resin composition of the present invention, it is preferable that the (A) binder polymer contains (A4) resin having a carboxyl group in its molecule.

Further, in the photosensitive resin composition of the present invention, it is preferable that an average particle diameter of the (B) cross-linked polymer particle falls within a range from 1 µm to 20 µm.

Further, in the photosensitive resin composition of the present invention, it is preferable that an amount of oil absorption of the (B) cross-linked polymer particle is 50 ml/100 g or more.

Further, in the photosensitive resin composition of the present invention, it is preferable that a blending amount of the (B) cross-linked polymer particle is 30 parts by weight to 100 parts by weight with respect to 100 parts by weight of the (A) binder polymer.

Further, it is preferable that the photosensitive resin composition of the present invention further includes (E) a phosphoric flame retardant.

Further, in the photosensitive resin composition of the present invention, it is preferable that the (E) phosphoric flame retardant be phosphinate.

Further, in the photosensitive resin composition of the present invention, it is preferable that a blending amount of the (E) phosphoric flame retardant be 5 parts by weight to 100 parts by weight with respect to 100 parts by weight of the (A) binder polymer.

Further, in the photosensitive resin composition of the present invention, it is preferable that the (C) thermosetting resin be polyfunctional epoxy resin.

Further, a resin film of the present invention can be obtained by applying the photosensitive resin composition to a surface of a base material and drying the surface.

Further, an insulating film of the present invention can be obtained by curing the resin film.

Further, a printed wiring board provided with an insulating film of the present invention is obtained by covering a printed wiring board with the insulating film.

EXAMPLES

The following description will discuss Examples of the present invention more specifically. It should be noted that the present invention is not limited to the Examples as below.

Synthesis Example 1

<(A) Binder Polymer 1>

Into a reaction vessel equipped with a stirrer, a thermometer, a dropping funnel, and a nitrogen-inlet tube, 100.0 g of methyltriglym (=1,2-bis(2-methoxyethoxy)ethane) was added as a solvent for polymerization and heated to 80° C. while being stirred in a nitrogen stream. Then, a mixture of 12.0 g (0.14 mol) of methacrylate, 28.0 g (0.16 mol) of benzyl methacrylate, 60.0 g (0.42 mol) of butyl methacrylate, and, as a radical polymerization initiator, 0.5 g of azobisisobutyronitrile, which had been mixed in advance at room temperature, was dropped from a dropping funnel for 3 hours while the mixture was maintained at 80° C. After the dropping was completed, the reactant solution was heated to 90° C. while being stirred, and the reactant solution was further stirred and reacted for 2 hours while the reactant solution was maintained at 90° C. Thus obtained was a resin solution containing a carboxyl group in its molecule. The obtained resin solution had a solid content concentration of 50%, a weight-average molecular weight of 48,000, and a solid content acid value of 78 mgKOH/g. Note that the solid content concentration, the weight-average molecular weight, and the acid value were measured in the following manner.

<Solid Content Concentration>

A measurement was carried out in accordance with JIS K 5601-1-2. For a drying condition, a condition of 170° C.×1 hour was selected.

<Weight-Average Molecular Weight>

A measurement was carried out under the following conditions.
Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluent: 30 mM LiBr+20 mM H3PO4 in DMF
Flow rate: 0.6 mL/min
Column temperature: 40° C.
Detection condition: RI:polarity (+), Response (0.5 sec)
Sample concentration: Approximately 5 mg/mL
Reference standard: PEG (polyethylene glycol).

<Acid Value>

A measurement was carried out in accordance with JIS K 5601-2-1.

Synthesis Example 2

<(A) Binder Polymer 2>

Into a reaction vessel equipped with a stirrer, a thermometer, and a nitrogen-inlet tube, 25.00 g of methyl triglym (=1,2-bis(2-methoxyethoxy)ethane) was added as a solvent for polymerization. Then, 5.16 g (0.024 mol) of norbornene diisocyanate was added therein and heated to 80° C. while being stirred in a nitrogen stream so that norbornene diisocyanate was dissolved in the solvent. Into a resultant solution was added, over 1 hour, a solution in which 50.0 g (0.025 mol) of polycarbonate diol (product name PCDL T5652, manufactured by Asahi Kasei Co., Ltd. and having a weight-average molecular weight of 2000) was dissolved in 25.00 g of methyl triglym. A resultant solution was stirred by heating at 80° C. for 5 hours to carry out a reaction. In this way, a resin solution having a urethane bond in its molecule was prepared. The resin solution thus obtained had a solid content concentration of 53% and a weight-average molecular weight of 5,600. Note that the solid content concentration and the weight-average molecular weight were measured in the same manner as in Synthesis Example 1.

Synthesis Example 3

<(A) Binder Polymer 3>

Into a reaction vessel equipped with a stirrer, a thermometer, and a nitrogen-inlet tube, 30.00 g of methyl triglym (=1,2-bis(2-methoxyethoxy)ethane) was added as a solvent for polymerization. Then, 10.31 g (0.050 mol) of norbornene diisocyanate was added and heated to 80° C. while being stirred in a nitrogen stream so that norbornene diisocyanate was dissolved in the solvent. Into a resultant solution was added, over 1 hour, a solution in which (i) 50.0 g (0.025 mol) of polycarbonate diol (product name PCDL T5652, manufactured by Asahi Kasei Co., Ltd. and having a weight-average molecular weight of 2000) and (ii) 6.51 g (0.050 mol) of 2-hydroxyethyl methacrylate were dissolved in 30.00 g of methyl triglym. A resultant solution was stirred by heating at 80° C. for 5 hours to carry out a reaction. In this way, a resin solution having a urethane bond and a methacryloyl group in its molecule was prepared. The resin solution thus obtained had a solid content concentration of 53% and a weight-average molecular weight of 5,200. Note that the solid content concentration and the weight-average molecular weight were measured in the same manner as in Synthesis Example 1.

Synthesis Example 4

<(A) Binder Polymer 4>

Into a reaction vessel equipped with a stirrer, a thermometer, and a nitrogen-inlet tube, 30.00 g of methyl triglym (=1,2-bis(2-methoxyethoxy)ethane) was added as a solvent for polymerization. Then, 10.31 g (0.050 mol) of norbornene diisocyanate was added and heated to 80° C. while being stirred in a nitrogen stream so that norbornene diisocyanate was dissolved in the solvent. Into a resultant solution was added, over 1 hour, a solution in which (i) 50.0 g (0.025 mol) of polycarbonate diol (product name PCDL T5652, manufactured by Asahi Kasei Co., Ltd. and having a weight-average molecular weight of 2000) and (ii) 3.70 g (0.025 mol) of 2,2-bis(hydroxymethyl)butanate were dissolved in 30.00 g of methyl triglym. A resultant solution was stirred by heating at 80° C. for 5 hours to carry out a reaction. In this way, a resin solution having a urethane bond and a carboxyl group in its molecule was prepared. The resin solution thus obtained had a solid content concentration of 52%, a weight-average molecular weight of 5,600, and a solid content acid value of 22 mgKOH/g. Note that the solid content concentration, the weight-average molecular weight, and the acid value were measured in the same manner as in Synthesis Example 1.

Synthesis Example 5

<(A) Binder Polymer 5>

Into a reaction vessel equipped with a stirrer, a thermometer, and a nitrogen-inlet tube, 40.00 g of methyl triglym (=1,2-bis(2-methoxyethoxy)ethane) was added as a solvent for polymerization. Then, 20.62 g (0.100 mol) of norbornene diisocyanate was added and heated to 80° C. while being stirred in a nitrogen stream so that norbornene diisocyanate was dissolved in the solvent. Into a resultant solution was added, over 1 hour, a solution in which (i) 50.0 g (0.025 mol)

of polycarbonate diol (product name PCDL T5652, manufactured by Asahi Kasei Co., Ltd. and having a weight-average molecular weight of 2000), (ii) 3.70 g (0.025 mol) of 2,2-bis(hydroxymethyl)butanate, and (iii) 13.02 g (0.100 mol) of 2-hydroxyethyl methacrylate were dissolved in 40.00 g of methyl triglym. A resultant solution was stirred by heating at 80° C. for 5 hours to carry out a reaction. In this way, a resin solution having a urethane bond, a carboxyl group, and a (meth)acryloyl group in its molecule was prepared. The resin solution thus obtained had a solid content concentration of 52%, a weight-average molecular weight of 8,600, and a solid content acid value of 18 mgKOH/g. Note that the solid content concentration, the weight-average molecular weight, and the acid value were measured in the same manner as in Synthesis Example 1.

Synthesis Example 6

<(A) Binder Polymer 6>

Into a reaction vessel equipped with a stirrer, a thermometer, and a nitrogen-inlet tube, 35.00 g of methyl triglym (=1,2-bis(2-methoxyethoxy)ethane) was added as a solvent for polymerization. Then, 10.31 g (0.050 mol) of norbornene diisocyanate was added and heated to 80° C. while being stirred in a nitrogen stream so that norbornene diisocyanate was dissolved in the solvent. Into a resultant solution was added, over 1 hour, a solution in which 50.0 g (0.025 mol) of polycarbonate diol (product name PCDL T5652, manufactured by Asahi Kasei Co., Ltd. and having a weight-average molecular weight of 2000) was dissolved in 35.00 g of methyl triglym. A resultant solution was stirred by heating at 80° C. for 2 hours. After a reaction was completed, 15.51 g (0.050 mol) of 3,3',4,4'-oxydiphthalic acid dianhydride (hereinafter referred to as ODPA) was added to an obtained reactant solution. After these compounds were added, the reactant solution was heated to 190° C. for 1 hour to carry out a reaction. A resultant solution was cooled down to 80° C., and 3.60 g (0.200 mol) of purified water was added to the resultant solution. After the water was added, a resultant solution was heated to 110° C. and refluxed by heating for 5 hours. In this way, a resin solution having a urethane bond, a carboxyl group, and an imide group in its molecule was prepared. The resin solution thus obtained had a solid content concentration of 53%, a weight-average molecular weight of 9,200, and a solid content acid value of 86 mgKOH/g. Note that the solid content concentration, the weight-average molecular weight, and the acid value were measured in the same manner as in Synthesis Example 1.

Examples 1 Through 12

Preparation of Photosensitive Resin Composition

Each of the (A) binder polymers obtained in Synthesis Examples, a (B) cross-linked polymer particle having a urethane bond in its molecule, a (C) thermosetting resin, a (D) photo-polymerization initiator, a (E) phosphorous flame retardant, other components, and an organic solvent were added to prepare a photosensitive resin composition. Respective amounts of constituent raw materials in terms of a resin solid content and respective of the constituent raw materials are shown in Tables 1 and 2. In Tables 1 and 2, an amount of 1,2-bis(2-methoxyethoxy)ethane, which is a solvent, indicates a total amount including the solvent contained in a corresponding one of the resin solutions synthesized above. The photosensitive resin composition was prepared by first mixing components by use of a general stirring device having a stirring wing and then passing a resultant mixture through a triple-roll mill twice to obtain a uniform solution. Each photosensitive resin had a particle diameter of not more than 10 μm as measured by use of a grindmeter. A mixed solution was completely defoamed in a defoaming device, and then subjected to the following evaluations.

TABLE 1

Unit: Part by Weight

|  |  | Ex. 1 | Ex. 2 | Ex. 3 | Ex. 4 | Ex. 5 | Ex. 6 |
|---|---|---|---|---|---|---|---|
| Component (A) | Binder polymer 2 | 60.0 | — | — | — | — | — |
|  | Binder polymer 3 | — | 60.0 | — | — | — | 60.0 |
|  | Binder polymer 4 | — | — | 60.0 | — | — | — |
|  | Binder polymer 5 | — | — | — | 60.0 | — | — |
|  | Binder polymer 6 | — | — | — | — | 60.0 | — |
| Component (B) | DAIMICBEAZ UCN-8070CM clear <1> | 30.0 | 30.0 | 30.0 | 30.0 | 30.0 | — |
|  | DAIMICBEAZ UCN-8150CM clear <2> | — | — | — | — | — | 30.0 |
| Component (C) | TEPIC-SP <3> | 10.0 | 10.0 | 10.0 | 10.0 | 10.0 | 10.0 |
| Component (D) | IRUGACURE369 <4> | 3.0 | 3.0 | 3.0 | 3.0 | 3.0 | 3.0 |
| Component (E) | Exolit OP-935 <5> | 20.0 | 20.0 | 20.0 | 20.0 | 20.0 | 20.0 |
| Other Components | FANCRYL FA-321M <6> | 15.0 | 15.0 | 15.0 | 15.0 | 15.0 | 15.0 |
|  | Florene AC-2000 <7> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |

TABLE 2

Unit: Part by Weight

|  |  | Ex. 7 | Ex. 8 | Ex. 9 | Ex. 10 | Ex. 11 | Ex. 12 |
|---|---|---|---|---|---|---|---|
| Component (A) | Binder polymer 1 | 42.0 | — | — | — | — | 42.0 |
|  | Binder polymer 3 | — | 18.0 | — | — | — | — |
|  | Binder polymer 4 | — | — | 42.0 | 42.0 | 42.0 | — |
|  | Binder polymer 5 | 18.0 | — | 18.0 | 18.0 | 18.0 | 18.0 |
|  | Binder polymer 6 | — | 42.0 | — | — | — | — |

TABLE 2-continued

Unit: Part by Weight

|  |  | Ex. 7 | Ex. 8 | Ex. 9 | Ex. 10 | Ex. 11 | Ex. 12 |
|---|---|---|---|---|---|---|---|
| Component (B) | DAIMICBEAZ UCN-8070CM clear <1> | 30.0 | 30.0 | 30.0 | 20.0 | 45.0 | — |
|  | Art-Pearl MM-120T <8> | — | — | — | — | — | 30.0 |
| Component (C) | TEPIC-SP <3> | 10.0 | 10.0 | 10.0 | 10.0 | 10.0 | 10.0 |
| Component (D) | IRUGACURE369 <4> | 3.0 | 3.0 | 3.0 | 3.0 | 3.0 | 3.0 |
| Component (E) | EXOLIT OP-935 <5> | 20.0 | 20.0 | 20.0 | 20.0 | 20.0 | 20.0 |
| Other Components | FANCRYL FA-321M <6> | 15.0 | 15.0 | 15.0 | 15.0 | 15.0 | 15.0 |
|  | Florene AC-2000 <7> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |

<1> A product name of a cross-linked polymer particle having a urethane bond in its molecule, manufactured by Dainichiseika Color & Chemicals Mfg. Co., Ltd. Amount of oil absorption: 70 ml/100 g. Average particle diameter: 7 μm
<2> A product name of a cross-linked polymer particle having a urethane bond in its molecule manufactured by Dainichiseika Color & Chemicals Mfg. Co., Ltd. Amount of oil absorption: 55 ml/100 g. Average particle diameter: 15 μm
<3> A product name of a multi-functional epoxy resin (triglycidyl isocyanurate) manufactured by Nissan Chemical Industries, Ltd.
<4> A product name of a photo-polymerization initiator manufactured by BASF Japan Ltd.
<5> A product name of phosphinate manufactured by Clariant (Japan) K. K.
<6> A product name of EO-modified bisphenol A dimethacrylate manufactured by Hitachi Chemical Co., Ltd.
<7> A product name of a butadiene defoaming agent manufactured by Kyoeisha Chemical Co., Ltd.
<8> A product name of a cross-linked polymer particle having a urethane bond in its molecule manufactured by Negami Chemical industrial co., ltd. Amount of oil absorption: 120 ml/100 g. Average particle diameter: 2 μm <Preparation of Applying Film on Polyimide Film>

With the use of a Baker's applicator, each of the photosensitive resin compositions thus prepared was flow-cast and applied to a polyimide film (manufactured by Kaneka Corporation: trade name 25NPI) having a thickness of 25 μm in an area of 100 mm×100 mm so as to have a final dried film thickness of 20 μm, and dried at 80° C. for 20 minutes. Resultant films were then exposed to ultraviolet rays having an integrated exposure amount of 300 mJ/cm$^2$. Then, the films were developed by spraying a 1.0 weight % sodium carbonate aqueous solution heated at 30° C., at a spraying pressure of 1.0 kgf/mm$^2$ for 90 seconds. After the development, the films were washed with purified water sufficiently, and then cured by heating in an oven at 150° C. for 30 minutes. Thus, cured films of the respective photosensitive resin compositions were prepared on the polyimide film.

<Evaluation of Cured Film>

The cured film thus prepared was evaluated in terms of the following items. Evaluation results are shown in Tables 3 and 4.

(i) Photosensitivity

Photosensitivity was evaluated by observing a surface of a cured film prepared in the same manner as in the aforementioned item <Preparation of Applying Film on Polyimide Film>. Note that exposure was carried out by placing a negative photomask having a line width/space width=100 μm/100 μm. The evaluation was based on definition as follows:

(I) "G (Good)" indicates a polyimide film in which a sensitive pattern of line width/space width=100/100 μm was clearly formed on a surface thereof and the sensitive pattern has no notable bold line and no residue from development; and
(II) "P (Poor)" indicates a polyimide film in which a sensitive pattern of line width/space width=100/100 μm was not formed on a surface thereof.

(ii) Tack-Free Property

With the use of a Baker's applicator, each of the photosensitive resin compositions thus prepared was flow-cast and applied to a polyimide film (manufactured by Kaneka Corporation: trade name 25NPI) having a thickness of 25 μm in an area of 100 mm×100 mm so as to have a final dried film thickness of 20 μm, and dried at 80° C. for 20 minutes. In this way, an applied film in a state after the solvent was dried off was prepared. Tack-free property of the film thus applied was evaluated in the following manner. First, the film applied with the photosensitive resin composition, which has been subjected to the drying-off of the solvent, was cut out into strips of 50 mm×30 mm. A strip was laid on top of another strip so that surfaces of such films of the respective strips face inward and are in contact with each other. A load of 300 g was applied for 3 seconds to a portion where the strips overlapped each other, and the load was removed. The strips were then peeled off each other. In this state, the applied films were observed. The evaluation was based on definition as follows:

(I) "G (Good)" indicates that applied films were not adhered to each other and no mark of adhesion was left on the applied films;
(II) "U (Unsatisfactory)" indicates that applied films were slightly attached to each other and a mark of adhesion was left on the applied films; and
(III) "P (Poor)" indicates that applied films were completely attached to each other and it was impossible to peel the applied films off each other.

(iii) Folding Endurance

In the same manner as in the item <Preparation of Applying Film on Polyimide Film>, cured-film-laminated films of the photosensitive resin compositions were formed to have a thickness of 20 μm in such a manner that a photosensitive resin composition was applied on a surface of a polyimide film (Apical 25 NPI manufactured by Kaneka Corporation) having a thickness of 25 μm. The evaluation of folding endurance of each of the cured-film-laminated films was carried out in the following manner. A cured-film-laminated film was cut out into strips of 50 mm×10 mm. Each of the strips was bent in half (at a point 25 mm from its edge) by 180° so that the cured film faced outward. A load of 5 kg was applied for 3 seconds to a portion where each of the strips was bent, and the load was removed. Then, apexes of the portion where each of the strips was bent were observed by use of a microscope. After the apexes were observed by use of the microscope, the portion where each of the strips was bent was opened. A load of 5 kg was applied to the portion again for 3 seconds and then removed, so that the cured-film-laminated film was completely opened. This operation was repeated, and the number of times when a crack occurred in the portion where each of the strips was bent was counted as the number of bending. The evaluation was carried out based on definition as follows:

(I) "G (Good)" indicates a cured film having no crack after 5 times of bending;

(II) "U (Unsatisfactory)" indicates a cured film having no crack after 3 times of bending; and (III) "P (Poor)" indicates a cured film having a crack after a first time of bending.

(iv) Electric Insulation Reliability

On a flexible copper-clad laminate (the thickness of an electrolyte copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, in the same manner as in the item <Preparation of Applying Film on Polyimide Film>, a cured film of a photosensitive resin composition having a thickness of 20 μm was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was carried out based on definition as follows:

(I) "G (Good)" indicates one in which 1000 hours after the start of the test, a resistance value was not less than $10^8$, and no occurrence of migration, formation of dendrites, or the like was observed; and (II) "P (Poor)" indicates one in which 1000 hours after the start of the test, an occurrence of migration, formation of dendrites, or the like was observed.

(v) Solder Heat Resistance

In the same manner as in the aforementioned item <Preparation of Applying Film on Polyimide Film>, a cured-film-laminated film of each of the photosensitive resin compositions was prepared to have a thickness of 20 μm in such a manner that a photosensitive resin composition was applied on a surface of a polyimide film (manufactured by Kaneka Corporation, APICAL 75NPI) having a thickness of 75 μm.

The cured-film-laminated film thus prepared was floated on a solder bath that was completely melted at 260° C., so that a surface of the cured-film-laminated film on which surface a cured film of the photosensitive resin composition was formed made contact with the solder bath. Ten seconds later, the cured-film-laminated film was pulled up. This operation was repeated 3 times, and a surface of the cured-film-laminated film was observed. The evaluation was carried out based on definition as follows:

(I) "G (Good)" indicates an applied film (cured-film-laminated film) having no problem; and (II) "P (Poor)" indicates an applied film (cured-film-laminated film) having a problem such as swelling or detachment.

(vi) Warpage

In the same manner as in the aforementioned item <Preparation of Applying Film on Polyimide Film>, a cured-film-laminated film of each of the photosensitive resin compositions was prepared to have a thickness of 20 μm in such a manner that a photosensitive resin composition was applied on a surface of a polyimide film (manufactured by Kaneka Corporation, APICAL 25NPI) having a thickness of 25 μm.

The cured-film-laminated film thus obtained was cut out into a film having an area of 50 mm×50 mm, and the film was placed on a flat and smooth table so that an applied film (cured film) thereof turned up. Then, how much an end portion of the film was warped was measured. FIG. 1 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm. Note that a film that rolled up into a cylinder was evaluated as "P (Poor)".

(vii) Flame Retardancy

A flame retardancy test was carried out as follows, in accordance with the UL94VTM standard for a flame retardancy test of plastic material. In the same manner as in the aforementioned item <Preparation of Applying Film on Polyimide Film>, a cured-film-laminated film of each of the photosensitive resin compositions was prepared to have a thickness of 20 μm in such a manner that a photosensitive resin composition was applied on both surfaces of a polyimide film (manufactured by Kaneka Corporation: trade name APICAL 25NPI) having a thickness of 25 μm. A prepared sample was cut out into a shape of 50 mm in width, 200 mm in length, and 75 μm in thickness (including the thickness of the polyimide film). Then, a marked line was formed on the sample at a point 125 mm from its edge and the sample was rolled into a cylinder having a diameter of about 13 mm. A PI tape was attached to the sample so that no gap was formed in an overlapping portion, of the sample, above the marked line (i.e., a 75-mm-long portion of the sample) and in an upper portion of the sample. In this way, 20 sample tubes for the flame retardancy test were prepared. Among them, 10 sample tubes were subjected to a treatment under a condition (1) (23° C./50% relative humidity/48 hours), while remaining 10 tubes were subjected to a treatment under a condition (2) (70° C., 168 hours) and cooled down in a desiccator filled with anhydrous calcium chloride for at least 4 hours. These samples were fixed upright by clamping their upper portions. Then, a burner was turned on and put closer to bottom portions of the samples for 3 seconds to ignite them. After 3 seconds passed, the burner was drawn from the samples, and it was measured how long it took for a flame or burning of each of the samples to be extinguished or to stop. Evaluation of the frame resistance was carried out based on definition as follows:

(I) If, under each condition ((1), (2)), (A) samples automatically stopped burning and flames thereof were automatically extinguished within at least 10 seconds but at most 10 seconds on average (of 10 samples) after the burner was drawn away from the samples and (B) each of the samples burned with a flame not reaching an evaluation line of each of the samples, a photosensitive resin composition thereof was evaluated as "G (Good)"; and (II) If there was even one sample which did not stop burning within 10 seconds or which burned with a flame reaching an evaluation line of the sample, a photosensitive resin composition thereof was evaluated as "P (Poor)".

(viii) Bleeding Out

The test piece which had been subjected to the electrical insulation reliability test was observed to examine whether or not the test piece had a slight swelling on a surface of the test piece, a swelling on a copper wiring line, a leak of oily matter, and the like. The evaluation was carried out based on definition as follows:

(I) "G (Good)" indicates one in which 1000 hours after the start of the test, no problem such as swelling or leak was observed on a surface of a test piece and on a copper wiring line;

(II) "P (Poor)" indicates one in which 1000 hours after the start of the test, a problem such as swelling or leak was observed on a surface of a test piece and on a copper wiring line.

TABLE 3

| Evaluation Item | Ex. 1 | Ex. 2 | Ex. 3 | Ex. 4 | Ex. 5 | Ex. 6 | Com. Ex. 1 | Com. Ex.2 | Com. Ex.3 |
|---|---|---|---|---|---|---|---|---|---|
| Photosensitivity | G | G | G | G | G | G | G | G | G |
| Tack-free Property | G | G | G | G | G | G | G | P | G |
| Folding Endurance | G | G | G | G | G | G | P | G | P |
| Electric Insulation Reliability | G | G | G | G | G | G | G | P | G |
| Solder Heat Resistance | G | G | G | G | G | G | G | G | G |
| Warpage (mm) | 1.0 | 2.0 | 1.0 | 2.0 | 2.0 | 2.0 | 10.0 | 2.0 | P |
| Flame Retardancy | G | G | G | G | G | G | G | G | P |
| Bleeding Out | G | G | G | G | G | G | G | P | G |

TABLE 4

| Evaluation Item | Ex. 7 | Ex. 8 | Ex. 9 | Ex. 10 | Ex. 11 | Ex. 12 |
|---|---|---|---|---|---|---|
| Photosensitivity | G | G | G | G | G | G |
| Tack-free Property | G | G | G | G | G | G |
| Folding Endurance | G | G | G | G | G | G |
| Electric Insulation Reliability | G | G | G | G | G | G |
| Solder Heat Resistance | G | G | G | G | G | G |
| Warpage (mm) | 0.5 | 2.0 | 1.0 | 2.0 | 0.5 | 1.5 |
| Flame Retardancy | G | G | G | G | G | G |
| Bleeding Out | G | G | G | G | G | G |

Comparative Example 1

Physical property evaluations were carried out in the same manner as in Example 1 by use of a polymethacrylate methyl cross-linked polymer particle (manufactured by Ganz Chemical Co., Ltd., trade name GanzPearl GM-0801S, amount of oil absorption 45 ml/100 g) instead of the cross-linked polymer particle, used in Example 1, having a urethane bond in its molecule (amount of oil absorption 70 ml/100 g). Evaluation results are shown in Table 3.

Comparative Example 2

Air was introduced into a reaction vessel equipped with a stirrer, a thermometer, a cooling tube, and an air-inlet tube. Subsequently, 196.80 g (0.39 mol) of polycarbonate diol (manufactured by Daicel Chemical Industries, Ltd., product name PLACCEL CD205PL, number-average molecular weight: 500), 58.30 g (0.39 mol) of 2,2-bis(hydroxymethyl) butanate, 37.60 g (0.35 mol) of diethylene glycol, 148.10 g (0.75 mol) of 1,4-cyclohexanedimethanol monoacrylate, 0.55 g of p-methoxyphenol, 0.55 g of dibutyltin dilaurate, and 110.20 g of methyl ethyl ketone were added into the reaction vessel and heated to 65° C. while being stirred uniformly in an air stream. Into a dripping vessel, 305.90 g (1.46 mol) of trimethyl hexamethylene diisocyanate was added. Then, trimethyl hexamethylene diisocyanate was dropped from the dripping vessel into the reaction vessel over 3 hours while being stirred uniformly at 65° C. After the dropping was completed, the dripping vessel was washed by use of 76.50 g of methyl ethyl ketone. After the dripping vessel was washed, a solution in the dripping vessel was charged as it is into the reaction vessel, and a resultant mixture was kept stirred uniformly for 2 hours at that temperature, Then, the resultant mixture was heated to 75° C. and stirred uniformly for 5 hours. Next, 9.30 g of methanol was added into the reaction vessel and was stirred uniformly at 60° C. for 30 minutes. Subsequently, 56.40 g of methyl ethyl ketone was added thereto to give a transparent resin solution. In this manner, a resin solution having a urethane bond and a methacryloyl group in its molecule was prepared. The resin solution thus prepared had a solid content concentration of 75% and a weight-average molecular weight of 14,800. Note that the solid content concentration and the weight-average molecular weight were measured in the same manner as in Synthesis Example 1. Then, (i) 66.7 g (solid content 50 g) of the resin solution thus prepared, (ii) 30 g of 2,2'-bis(4-methacryloxypentaethoxy phenyl)propane which served as a radical polymerizable compound, (iii) 162.5 g (solid content 65 g) of a resin solution which served as a binder resin and was obtained by copolymerizing methacrylate, methyl methacrylate, and butyl acrylate in a weight ratio of 22:71:7 (a solution which had a weight-average molecular weight of 80,000 and a solid content acid value of 143 mgKOH/g and was obtained by dissolving methacrylate, methyl methacrylate, and butyl acrylate in a solution of methyl cellsolve/toluene=6/4 (weight ratio) so as to have a solid content concentration of 40%), (iv) 3.5 g of benzophenone and 0.1 g of N,N'-tetraethyl-4,4'-diaminobenzophenone, both of which served as a photo-polymerization initiator, (v) 20 g (solid content 15 g) of a 75% methyl ethyl ketone solution of a block isocyanate compound which served as a thermosetting resin and was obtained by reacting an isocyanurate type hexamethylene diisocyanate isocyanate compound and methyl-ethyl ketone oxime which served as a blocking agent, (vi) 40 g of CR-747 (a name of a product manufactured by DAIHACHI CHEMICAL INDUSTRY CO., LTD.) which served as a phosphorous flame retardant, (vii) 85 g of acetone which served as a diluent were blended, stirred, and then dispersed by use of a triple-roll mill to prepare a photosensitive resin composition. Physical properties of the photosensitive resin composition thus prepared were evaluated in the same manner as in Example 1. Evaluation results are shown in Table 3. Note that the photosensitive resin composition does not contain the component (B).

Comparative Example 3

To 100.00 g of cresol novolac type epoxy resin YDCN-703 (manufactured by Tohto Kasei Co., Ltd., epoxy equivalent of 200), 80.00 g of carbitol acetate was added and heated to 120° C. while being stirred so that carbitol acetate was dissolved in the epoxy resin. After a resultant solution was cooled down to 60° C., 43.48 g (solid content 20.00 g) of an emulsion (glass transition temperature −8° C., solid content 46.0%) of a (meth)acrylic ester polymer particle was added and heated to 130° C. while being stirred, so that water was completely eliminated. Subsequently, 36.90 g of an acrylic acid, 0.14 g of chromic chloride hexahydrate, and 0.11 g of methylhydroquinone were added to carry out a reaction at 110° C. for 3 hours. An acid value of a reactant became 3.0 mgKOH/g, so that an introduction of an acryloyl group was confirmed. Next, 45.60 g of tetrahydrophthalic anhydride, 29.00 g of ethyl carbitol acetate, and 0.14 g of lithium chloride anhydrous were added to react at 100° C. for 3 hours to prepare a mixed resin solution of the reactant and ethyl carbitol acetate, which mixed resin solution contained 6.4% of a (meth)acrylic ester polymer particle and 58.6% of a photo-curable resin having an acid value of 90 mgKOH/g. Then, 90 g (solid content: polymer particle 5.8 g and photo-curable resin 52.7 g) of a resultant resin solution, 15.0 g of pentaerythritol tetraacrylate which served as a multi-functional monomer, 20.0 g of ethyl carbitol acetate which served as a diluent, 8.0 g of IRGACURE 907 (a trade name of a product manufactured by BASF Japan Ltd.) which served as a photo-polymerization initiator, 20.0 g of a phenol novolac type epoxy resin which served as a thermosetting resin, 2.0 g of dicyandiamide which served as an epoxy curing agent, 30.0 g of barium sulfate which served as a filler, 1.2 g of Florene AC300 (a name of a product manufactured by Kyoeisha Chemical Co., Ltd.) which served as defoaming agent, and 0.6 g of phthalocyanine green which served as a pigment were blended, stirred, and dispersed by use of a triple-roll mill to prepare a photosensitive resin composition. Physical properties of the photosensitive resin composition thus obtained were evaluated in the same manner as in Example 1. Evaluation results are shown in Table 3. Note that the photosensitive resin composition does not contain the component (B).

INDUSTRIAL APPLICABILITY

The present invention is applicable to protective films etc. of various circuit substrates.

REFERENCE SIGNS LIST

1: Polyimide film laminated with photosensitive resin composition
2: Amount of warpage
3: Flat and smooth table

The invention claimed is:

1. A photosensitive resin composition, comprising at least:
(A) binder polymer;
(B) cross-linked polymer particles, whose polymer has a urethane bond in its molecule;
(C) thermosetting resin; and
(D) photo-polymerization initiator,
wherein the (A) binder polymer contains (A1) resin having a urethane bond in its molecule and wherein a blending amount of the (B) cross-linked polymer particle is 30 parts by weight to 100 parts by weight with respect to 100 parts by weight of the (A) binder polymer.

2. The photosensitive resin composition as set forth in claim 1,
wherein the (A1) resin having a urethane bond in its molecule has at least one organic group selected from the group consisting of the following (a1)-(a3):
(a1) a (meth)acryloyl group;
(a2) a carboxyl group; and
(a3) an imide group.

3. The photosensitive resin composition as set forth in claim 1,
wherein the (A) binder polymer contains (A2) resin having an imide group in its molecule.

4. The photosensitive resin composition as set forth in claim 1,
wherein the (A) binder polymer contains (A3) resin having a (meth)acryloyl group in its molecule.

5. The photosensitive resin composition as set forth in claim 1,
wherein the (A) binder polymer contains (A4) resin having a carboxyl group in its molecule.

6. The photosensitive resin composition as set forth in claim 1,
wherein an average particle diameter of the (B) cross-linked polymer particle falls within a range from 1 μm to 20 μm.

7. The photosensitive resin composition as set forth in claim 1,
wherein an amount of oil absorption of the (B) cross-linked polymer particle is 50 ml/100 g or more.

8. The photosensitive resin composition as set forth in claim 1, further comprising
(E) a phosphoric flame retardant.

9. The photosensitive resin composition as set forth in claim 8,
wherein the (E) phosphoric flame retardant is phosphinate.

10. The photosensitive resin composition as set forth in claim 8,
wherein a blending amount of the (E) phosphoric flame retardant is 5 parts by weight to 100 parts by weight with respect to 100 parts by weight of the (A) binder polymer.

11. The photosensitive resin composition as set forth in claim 1,
wherein the (C) thermosetting resin is polyfunctional epoxy resin.

12. A resin film, which is obtained by applying a photosensitive resin composition as recited in claim 1 to a surface of a base material and drying the surface.

13. An insulating film, which is obtained by curing the resin film as recited in claim 12.

14. A printed wiring board provided with an insulating film, wherein a printed wiring board is covered with the insulating film as recited in claim 13.

* * * * *